United States Patent
Matsui et al.

(10) Patent No.: US 10,497,907 B1
(45) Date of Patent: Dec. 3, 2019

(54) METHOD FOR MANUFACTURING DISPLAY DEVICE BY UV-CURING ORGANIC LAYER OF SEALING FILM

(71) Applicant: Sharp Kabushiki Kaisha, Sakai, Osaka (JP)

(72) Inventors: Akihiro Matsui, Sakai (JP); Jumpei Takahashi, Sakai (JP); Tohru Senoo, Sakai (JP); Takeshi Hirase, Sakai (JP); Tohru Sonoda, Sakai (JP); Takashi Ochi, Sakai (JP); Hisao Ochi, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 16/466,682

(22) PCT Filed: Sep. 26, 2017

(86) PCT No.: PCT/JP2017/034817
§ 371 (c)(1),
(2) Date: Jun. 5, 2019

(87) PCT Pub. No.: WO2019/064357
PCT Pub. Date: Apr. 4, 2019

(51) Int. Cl.
*H01L 51/56* (2006.01)
*H01L 51/52* (2006.01)
(Continued)

(52) U.S. Cl.
CPC .......... *H01L 51/56* (2013.01); *H01L 27/3244* (2013.01); *H01L 51/0097* (2013.01);
(Continued)

(58) Field of Classification Search
CPC .. H01L 51/5253; H01L 51/5256; H01L 51/56
See application file for complete search history.

(56) References Cited

U.S. PATENT DOCUMENTS

| 9,843,013 B2 * | 12/2017 | Sonoda | H01L 51/524 |
| 2007/0176173 A1 * | 8/2007 | Ramakrishnan | H01L 51/5234 257/40 |

(Continued)

FOREIGN PATENT DOCUMENTS

| JP | 58-61275 A | 4/1983 |
| JP | 2007-005189 A | 1/2007 |

(Continued)

OTHER PUBLICATIONS

Official Communication issued in International Patent Application No. PCT/JP2017/034817, dated Dec. 12, 2017.

*Primary Examiner* — Michael Jung
(74) *Attorney, Agent, or Firm* — Keating & Bennett, LLP

(57) ABSTRACT

Provided is a method for manufacturing an organic EL display device, including forming a sealing film to cover an organic EL element. The forming a sealing film includes forming a first inorganic layer to cover the organic EL element, forming a partition on the first inorganic layer, forming an organic layer on the first inorganic layer by applying an organic material inward from the partition on a surface of the first inorganic layer, removing the partition, and forming a second inorganic layer on the first inorganic layer to cover the organic layer.

5 Claims, 7 Drawing Sheets

(51) Int. Cl.
*H01L 27/32* (2006.01)
*H01L 51/00* (2006.01)
*B05D 1/00* (2006.01)

(52) U.S. Cl.
CPC ...... *H01L 51/5253* (2013.01); *H01L 51/5256* (2013.01); *B05D 1/60* (2013.01); *H01L 2251/5338* (2013.01)

(56) References Cited

U.S. PATENT DOCUMENTS

| | | |
|---|---|---|
| 2011/0140164 A1 | 6/2011 | Seo et al. |
| 2016/0072099 A1* | 3/2016 | Okamoto ............ H01L 51/5253 257/40 |
| 2016/0155945 A1 | 6/2016 | Lin et al. |
| 2017/0077463 A1* | 3/2017 | Chen ................. H01L 51/0011 |
| 2017/0244063 A1 | 8/2017 | Furuie |

FOREIGN PATENT DOCUMENTS

| | | |
|---|---|---|
| JP | 2011-124228 A | 6/2011 |
| JP | 2013-073820 A | 4/2013 |
| JP | 2015-201291 A | 11/2015 |
| JP | 2017-147165 A | 8/2017 |

* cited by examiner

METHOD FOR MANUFACTURING DISPLAY DEVICE BY UV-CURING ORGANIC LAYER OF SEALING FILM

TECHNICAL FIELD

The disclosure relates to a method for manufacturing a display device.

BACKGROUND ART

In recent years, organic EL display devices, which use organic electroluminescence (EL) elements and are of the self-luminous type, have attracted attention as a display device that can replace the liquid crystal display device. For the organic EL display device, a seal structure is proposed to inhibit degradation of the organic EL element due to penetration of, for example, moisture and oxygen. The seal structure includes a sealing film covering the organic EL element, and the sealing film includes a stack of an inorganic film and an organic film.

For example, disclosed is an organic EL display device including a sealing member including an organic layer and an inorganic layer. The organic layer covers an organic EL element and the inorganic layer is formed on the organic layer (e.g., see Patent Literature 1).

CITATION LIST

Patent Literature

PTL 1: JP 2013-73820A

SUMMARY

Technical Problem

However, the organic EL display device disclosed in PTL 1 has a problem in that it is necessary to provide, in a peripheral portion of a light emitting region, a dam wall (bank) that restricts spreading of an organic material ejected in a case that the organic material is ejected by using an ink-jet method to form an organic layer; thus, frame narrowing of the organic EL display device is difficult.

The disclosure has been accomplished in view of the above, and an object of the disclosure is to provide a method for manufacturing a display device, the method ensuring a sealing property of a seal film and causing frame narrowing to be provided.

Solution to Problem

In order to achieve the above object, a method for manufacturing a display device according to the disclosure includes forming a light emitting element on a base substrate, and forming a sealing film to cover the light emitting element. The forming a sealing film includes forming a first inorganic layer to cover the light emitting element, forming a partition on the first inorganic layer, forming an organic layer on the first inorganic layer by applying an organic material inward from the partition on a surface of the first inorganic layer, removing the partition, and forming a second inorganic layer on the first inorganic layer to cover the organic layer.

Advantageous Effects of Disclosure

The dam wall for restricting spreading of an organic material is unnecessary. Thus, there is no need to provide the dam wall in the frame portion. As a result, the frame narrowing of the display device can be provided.

DESCRIPTION OF EMBODIMENTS

Embodiments of the disclosure will be described below in detail with reference to the drawings. The disclosure is not limited to the embodiments described below.

First Embodiment

Figure 1:
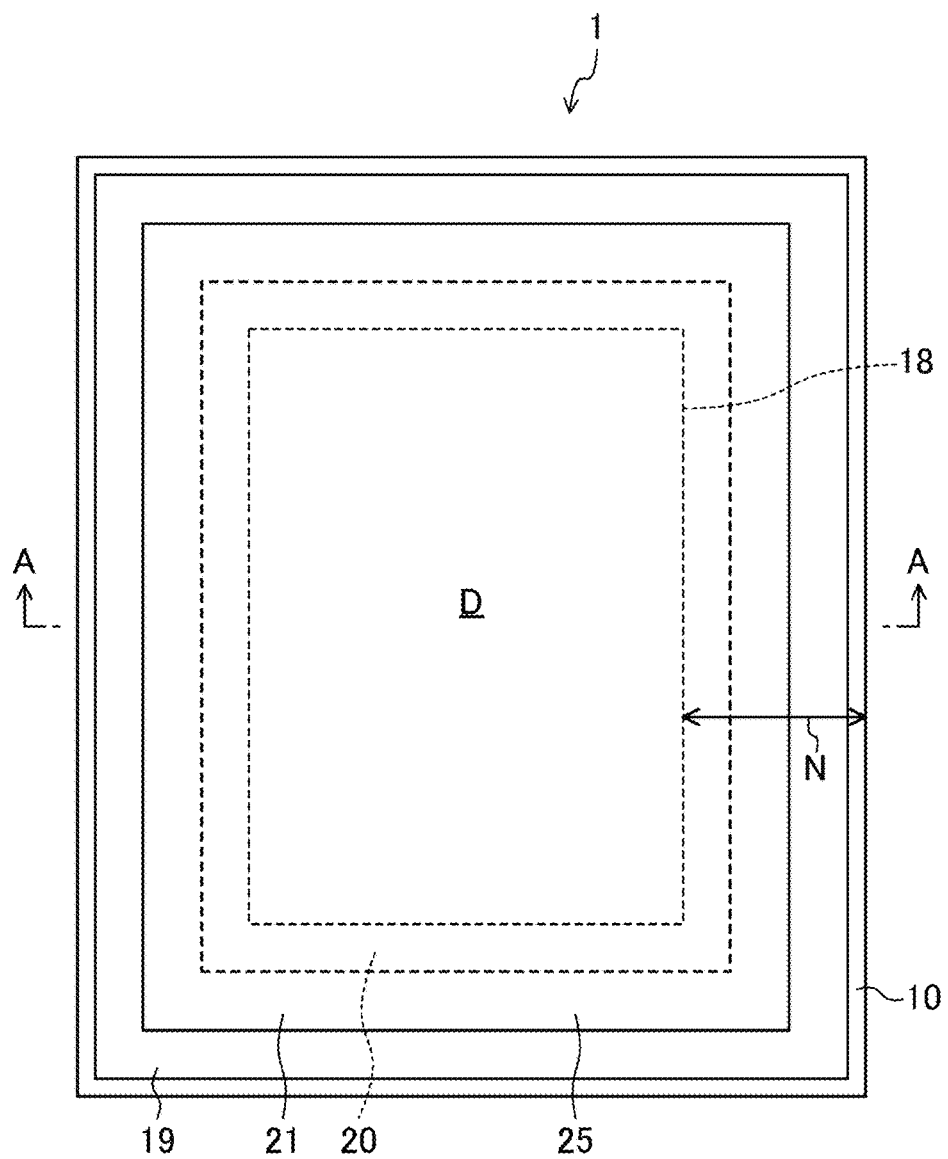
FIG. 1 is a plan view of an organic EL display device according to a first embodiment of the disclosure, schematically illustrating a configuration of the device.
Figure 2:
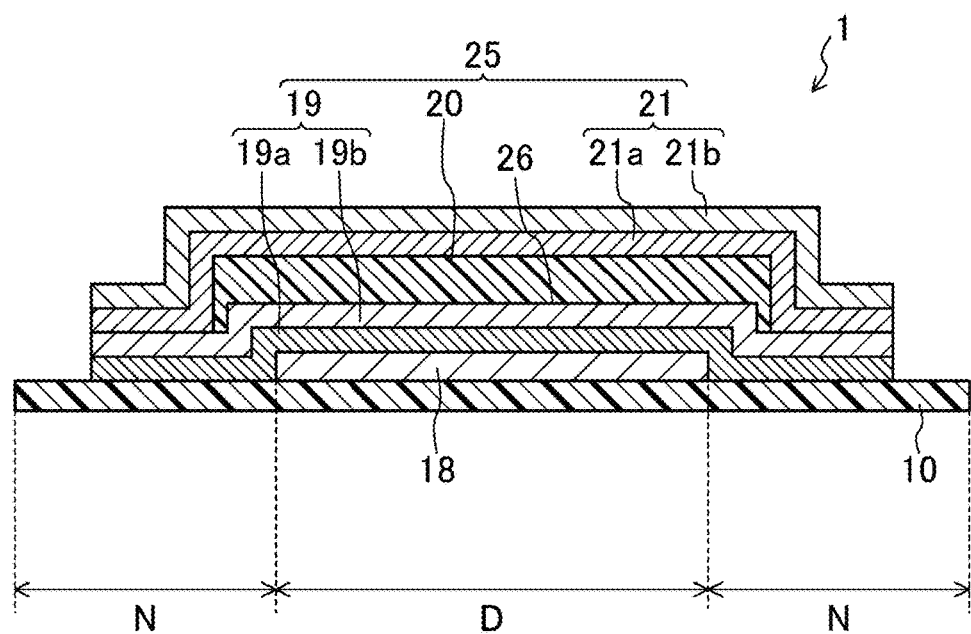
FIG. 2 is a cross-sectional view of the organic EL display device taken along line A-A of FIG. 1, schematically illustrating the configuration of the device.
Figure 3:
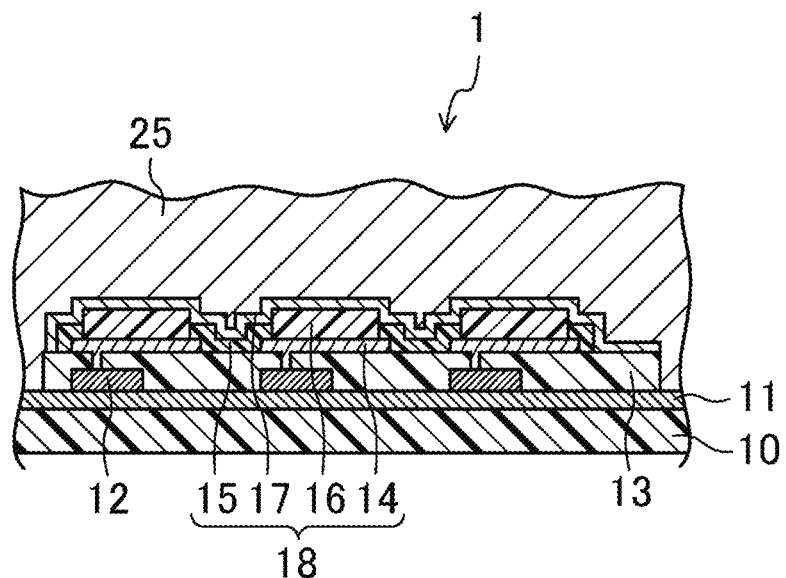
FIG. 3 is a cross-sectional view of the organic EL display device according to the first embodiment of the disclosure, illustrating an internal structure of the device.
Figure 4:
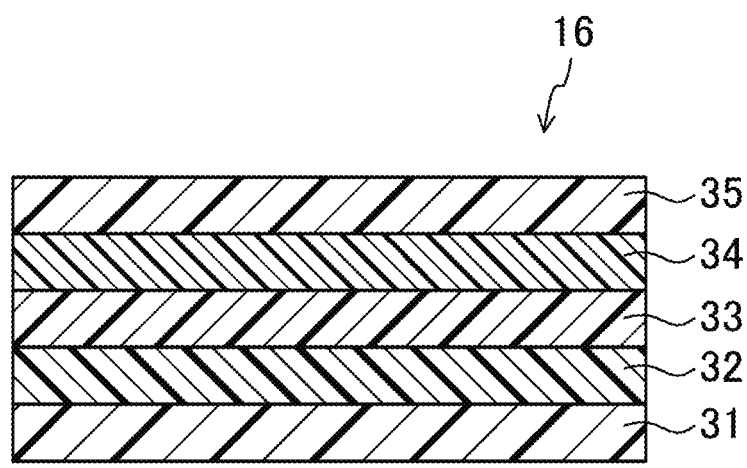
FIG. 4 is a cross-sectional view of an organic EL layer included in the organic EL display device according to the first embodiment of the disclosure.

FIG. 1 is a plan view of an organic EL display device according to the present embodiment, schematically illustrating a configuration of the device. FIG. 2 is a cross-sectional view of the organic EL display device taken along line A-A of FIG. 1, schematically illustrating the configuration of the device. FIG. 3 is a cross-sectional view of the organic EL display device, illustrating an internal structure of the device. FIG. 4 is a cross-sectional view of an organic EL layer included in the organic EL display device.

As illustrated in FIGS. 1 and 2, the organic EL display device 1 includes a base substrate 10, an organic EL element 18, and a sealing film 25. The base substrate 10 is provided as a base substrate and transparent. The organic EL element 18 is disposed on (indirectly on) the base substrate 10. The sealing film 25 is disposed to cover the organic EL element 18.

As illustrated in FIG. 1, in the organic EL display device 1, the organic EL element 18 is disposed in a rectangular shape in a plan view. Thus, a display region D is defined in a rectangular shape, for displaying images. In the display region D, a plurality of pixels are arranged in a matrix form. Each of the pixels includes a subpixel for display of red gradation, a subpixel for display of green gradation, and a subpixel for display of blue gradation. These subpixels are disposed adjacent to one another.

As illustrated in FIG. 1, the organic EL display device 1 includes a frame region (non-display region) N. The frame region N is defined around the display region D and has a frame shape. As illustrated in FIG. 3, the organic EL display device 1 includes, between the base substrate 10 and the organic EL element 18, a base coating film 11, a plurality of TFTs 12, and an interlayer insulating film 13, which are arranged in the order stated, with the base coating film 11 being closest to the base substrate 10.

The base substrate 10 is a plastic substrate including a polyimide resin, for example. In the present embodiment, the illustrated example of the base substrate is a flexible and insulating transparent resin substrate, but the base substrate may be an insulating transparent glass substrate or an electrically conductive opaque metal sheet, for example.

As illustrated in FIG. 3, the base coating film 11 is disposed over the base substrate 10. The base coating film 11 is an inorganic film, such as a silicon oxide film or a silicon nitride film, for example.

As illustrated in FIG. 3, the TFT 12 is a switching element provided for each of the subpixels and disposed over the base coating film 11. The TFTs 12 each include, for example, a gate electrode, a gate insulator film, a semiconductor layer, and source and drain electrodes. The gate electrode is disposed over the base coating film 11. The gate insulator film is disposed to cover the gate electrode. The semiconductor layer is disposed over the gate insulator film and overlap the gate electrode. The source and drain electrodes are disposed over the semiconductor layer and face each other. In the present embodiment, the bottom-gate type is described as an example of the TFT 12, but the TFT 12 may be of the top-gate type.

As illustrated in FIG. 3, the interlayer insulating film 13 is disposed to cover the TFTs 12 except for a portion of each of the drain electrodes. The interlayer insulating film 13 includes, for example, a transparent organic resin material, such as an acrylic resin.

The organic EL element 18 is disposed over the display region D. As illustrated in FIG. 3, the organic EL element 18 includes first electrodes 14, edge covers 15, organic EL layers 16, and second electrodes 17, which are arranged in the order stated over the interlayer insulating film 13.

As illustrated in FIG. 3, the plurality of first electrodes 14 are arranged in a matrix form over the interlayer insulating film 13, and correspond to the respective subpixels. As illustrated in FIG. 3, the first electrodes 14 are connected to the respective drain electrodes of the TFTs 12 via respective contact holes formed in the interlayer insulating film 13. The first electrode 14 functions to inject holes into the organic EL layer 16. It is more preferable that the first electrodes 14 include a material having a large work function to improve the efficiency of hole injection into the organic EL layer 16. Examples of materials that may be included in the first electrode 14 include metal materials, such as silver (Ag), aluminum (Al), vanadium (V), cobalt (Co), nickel (Ni), tungsten (W), gold (Au), calcium (Ca), titanium (Ti), yttrium (Y), sodium (Na), ruthenium (Ru), manganese (Mn), indium (In), magnesium (Mg), lithium (Li), ytterbium (Yb), and lithium fluoride (LiF). Further examples of materials that constitute the first electrode 14 include alloys such as magnesium (Mg)-copper (Cu), magnesium (Mg)-silver (Ag), sodium (Na)-potassium (K), astatine (At)-astatine oxide ($AtO_2$), lithium (Li)-aluminum (Al), lithium (Li)-calcium (Ca)-aluminum (Al), and lithium fluoride (LiF)-calcium (Ca)-aluminum (Al). Further examples of materials that may be included in the first electrode 14 include electrically conductive oxides, the examples of which include tin oxide (SnO), zinc oxide (ZnO), indium tin oxide (ITO), and indium zinc oxide (IZO). The first electrode 14 may include a stack of two or more layers of any of the above-mentioned materials. Examples of materials having a large work function include indium tin oxide (ITO) and indium zinc oxide (IZO).

As illustrated in FIG. 3, the edge cover 15 is disposed in a lattice pattern and surrounds the outer perimeter portion of the first electrodes 14. The edge cover 15 may be, for example, an inorganic film or an organic film. Examples of the inorganic film include silicon oxide ($SiO_2$), silicon nitride (SiNx (x is a positive number)) such as trisilicon tetranitride ($Si_3N_4$), and silicon oxynitride (SiON). Examples of the organic film include polyimide resin, acrylic resin, polysiloxane resin, and novolac resin.

As illustrated in FIG. 3, the plurality of organic EL layers 16 are arranged in a matrix form on the respective first electrodes 14 and correspond to the respective subpixels. As illustrated in FIG. 4, the organic EL layers 16 each include a hole injecting layer 31, a hole transport layer 32, a light emitting layer 33, an electron transport layer 34, and an electron injecting layer 35, which are arranged in the order stated over the first electrode 14.

The hole injecting layer 31 is also referred to as an anode organic layer and has functions to reduce the energy level difference between the first electrode 14 and the organic EL layer 16 to improve the efficiency of hole injection into the organic EL layer 16 from the first electrode 14. Examples of materials that may be included in the hole injecting layer 31 include triazole derivatives, oxadiazole derivatives, imidazole derivatives, polyarylalkane derivatives, pyrazoline derivatives, phenylenediamine derivatives, oxazole derivatives, styrylanthracene derivatives, fluorenone derivatives, hydrazone derivatives, and stilbene derivatives.

The hole transport layer 32 functions to improve the efficiency of hole transport from the first electrode 14 to the organic EL layer 16. Examples of materials that may be included in the hole transport layer 32 include porphyrin derivatives, aromatic tertiary amine compounds, styrylamine derivatives, polyvinylcarbazole, poly-p-phenylenevinylene, polysilane, triazole derivatives, oxadiazole derivatives, imidazole derivatives, polyarylalkane derivatives, pyrazoline derivatives, pyrazolone derivatives, phenylenediamine derivatives, arylamine derivatives, amine-substituted chalcone derivatives, oxazole derivatives, styrylanthracene derivatives, fluorenone derivatives, hydrazone derivatives, stilbene derivatives, hydrogenated amorphous silicon, hydrogenated amorphous silicon carbide, zinc sulfide, and zinc selenide.

The light emitting layer 33 is a region where the holes and the electrons recombine, when a voltage is applied via the first electrode 14 and the second electrode 17, holes and electrons are injected from the first electrode 14 and the second electrode 17, respectively. The light emitting layer 33 includes a material having a high light emitting efficiency. Examples of materials that may be included in the light emitting layer 33 include metal oxinoid compounds (8-hydroxyquinoline metal complexes), naphthalene derivatives, anthracene derivatives, diphenyl ethylene derivatives, vinyl acetone derivatives, triphenylamine derivatives, butadiene derivatives, coumarin derivatives, benzoxazole derivatives, oxadiazole derivatives, oxazole derivatives, benzimidazole derivatives, thiadiazole derivatives, benzothiazole derivatives, styryl derivatives, styrylamine derivatives, bisstyrylbenzene derivatives, trisstyrylbenzene derivatives, perylene derivatives, perinone derivatives, aminopyrene derivatives, pyridine derivatives, rhodamine derivatives, aquidine derivatives, phenoxazone, quinacridone derivatives, rubrene, poly-p-phenylenevinylene, and polysilane.

The electron transport layer 34 functions to facilitate migration of the electrons to the light emitting layer 33 efficiently. Examples of materials that may be included in the electron transport layer 34 include organic compounds, the examples of which include oxadiazole derivatives, triazole derivatives, benzoquinone derivatives, naphthoquinone derivatives, anthraquinone derivatives, tetracyanoanthraquinodimethane derivatives, diphenoquinone derivatives, fluorenone derivatives, silole derivatives, and metal oxinoid compounds.

The electron injecting layer 35 functions to reduce the energy level difference between the second electrode 17 and the organic EL layer 16, to improve the efficiency of electron injection into the organic EL layer 16 from the second electrode 17. By this function, the driving voltage for the organic EL element 18 can be reduced. Note that the electron injection layer 35 is also referred to as a cathode organic layer. Examples of materials that constitute the electron injection layer 35 include inorganic alkaline compounds such as lithium fluoride (LiF), magnesium fluoride ($MgF_2$), calcium fluoride ($CaF_2$), strontium fluoride ($SrF_2$), and barium fluoride ($BaF_2$); aluminum oxide ($Al_2O_3$), and, strontium oxide (SrO).

As illustrated in FIG. 3, the second electrode 17 is disposed to cover the organic EL layers 16 and the edge covers 15. The second electrode 17 functions to inject electrons into the organic EL layer 16. It is more preferable that the second electrode 17 includes a material having a small work function to improve the efficiency of electron injection into the organic EL layer 16.

Examples of materials that may be included in the second electrode 17 include silver (Ag), aluminum (Al), vanadium (V), cobalt (Co), nickel (Ni), tungsten (W), gold (Au), calcium (Ca), titanium (Ti), yttrium (Y), sodium (Na), ruthenium (Ru), manganese (Mn), indium (In), magnesium (Mg), lithium (Li), ytterbium (Yb), and lithium fluoride (LiF). Further the second electrode 17 may be formed of alloys such as (Mg)-copper (Cu), magnesium (Mg)-silver (Ag), sodium (Na)-potassium (K), astatine (At)-astatine oxide ($AtO_2$), lithium (Li)-aluminum (Al), lithium (Li)-calcium (Ca)-aluminum (Al), and lithium fluoride (LiF)-calcium (Ca)-aluminum (Al), for example. Further examples of materials that may be included in the second electrode 17 include electrically conductive oxides, the examples of which include tin oxide (SnO), zinc oxide (ZnO), indium tin oxide (ITO), and indium zinc oxide (IZO). The second electrode 17 may include a stack of two or more layers of any of the above-mentioned materials. Examples of materials having a small work function include magnesium (Mg), lithium (Li), lithium fluoride (LiF), magnesium (Mg)-copper (Cu), magnesium (Mg)-silver (Ag), sodium (Na)-potassium (K), lithium (Li)-aluminum (Al), lithium (Li)-calcium (Ca)-aluminum (Al), and lithium fluoride (LiF)-calcium (Ca)-aluminum (Al).

The sealing film 25 is disposed over the display region D and the non-display region N, and covers the organic EL element 18. The sealing film 25 functions to protect the organic EL element 18 from moisture and oxygen. As illustrated in FIG. 2, the sealing film 25 includes a first inorganic layer 19, an organic layer 20, and a second inorganic layer 21, which are arranged in this order from the organic EL element 18 side.

More specifically, the sealing film 25 is disposed on the surface of the organic EL element 18, and includes the first inorganic layer 19, the organic layer 20, and the second inorganic layer 21. The first inorganic layer 19 includes a first inorganic film. The organic layer 20 includes an organic film and is disposed on the surface of the first inorganic layer 19. The second inorganic layer 21 includes a second inorganic film and is disposed on the surface of the organic layer 20.

As illustrated in FIG. 2, the first inorganic layer 19 includes a silicon oxide (SiOx) layer 19a and a silicon nitride (SiNx) layer 19b. The silicon oxide layer 19a is disposed on the surface of the organic EL element 18. The silicon nitride layer 19b is disposed on the surface of the silicon oxide layer 19a and is in contact with the organic layer 20.

As illustrated in FIG. 2, the second inorganic layer 21 includes a silicon oxide layer 21a and a silicon nitride layer 21b. The silicon oxide layer 21a is disposed on the surface of the organic layer 20. The silicon nitride layer 21b is disposed on the surface of the silicon oxide layer 21a.

The organic layer 20 is formed of an organic film such as acrylate, polyurea, parylene, polyimide, or polyamide. As illustrated in FIG. 2, the organic layer 20 is covered by the second inorganic layer 21.

The organic EL display device 1, configured as described above, is flexible. In each of the subpixels, the light emitting layer 33 of the organic EL layer 16 is configured to emit light via the TFT 12 appropriately so that images can be displayed.

Next, a method for manufacturing the organic EL display device according to the present embodiment will be described. FIGS. 5 to 8 are cross-sectional views illustrating a method for manufacturing the organic EL display device according to the present embodiment.

The organic EL display device 1 according to the present embodiment can be produced in the following manner, for example. First, as illustrated in FIG. 3, the base coating film 11 is formed on the surface of the base substrate 10, which includes a polyimide resin. Thereafter, the plurality of TFTs 12 for driving the organic EL element 18 are formed on the base coating film 11 at a predetermined interval. Next, a photosensitive acrylic resin is applied to the base coating film 11, on which the TFTs 12 are disposed, by spin coating. The applied photosensitive acrylic resin is exposed to a predetermined amount of light through a photomask having a predetermined exposure pattern and then is subjected to development with an alkaline developer. In this manner, the interlayer insulating film 13 is formed over the base coating film 11 to cover the TFTs 12, as illustrated in FIG. 3. In the process, contact holes (e.g., 5 μm in diameter) for electrically connecting the first electrodes 14 to the TFTs 12 are formed in the interlayer insulating film 13.

Next, as illustrated in FIG. 3, the organic EL element 18 (first electrodes 14, edge covers 15, organic EL layers 16 (hole injecting layers 31, hole transport layers 32, light emitting layers 33, electron transport layers 34, electron injecting layers 35), second electrode 17) are formed on the surface of the interlayer insulating film 13 by using a known method.

Figure 5:
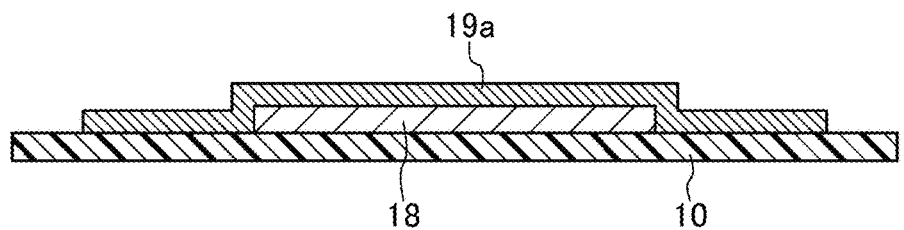
FIG. 5 is a cross-sectional view illustrating a method for manufacturing the organic EL display device according to the first embodiment of the disclosure.

Next, the first inorganic layer 19 is formed to cover the organic EL element 18. More specifically, first, silicon oxide is stacked over the surfaces of the base substrate 10 and the organic EL element 18 by using, for example, a plasma CVD method with a mask, a sputtering method, or an atomic layer deposition method (ALD method). Thus, the silicon oxide layer 19a is formed to cover the surface of the organic EL element 18, as illustrated in FIG. 5.

Figure 6:
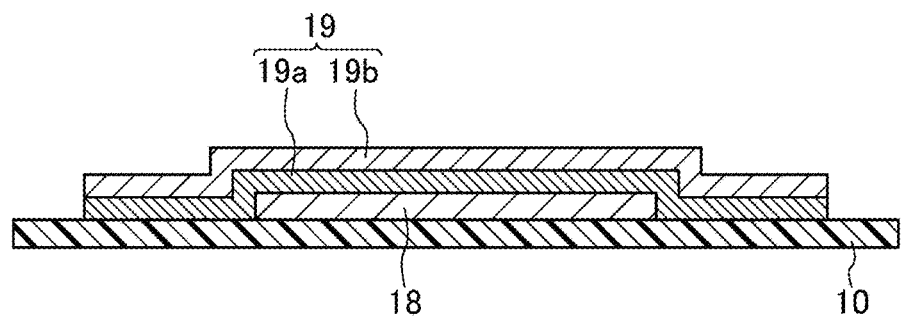
FIG. 6 is a cross-sectional view illustrating the method for manufacturing the organic EL display device according to the first embodiment of the disclosure.

Next, as with the silicon oxide layer 19a described above, silicon nitride is stacked on the surface of the silicon oxide layer 19a by using, for example, a plasma CVD method with a mask, a sputtering method, or an atomic layer deposition method (ALD method). Thus, the silicon nitride layer 19b is formed on the base substrate by use of a mask having a larger opening than the display region D to cover the surface of the organic EL element 18, as illustrated in FIG. 6. In this manner, the first inorganic layer 19, which includes the silicon oxide layer 19a and the silicon nitride layer 19b, is formed.

Figure 7:
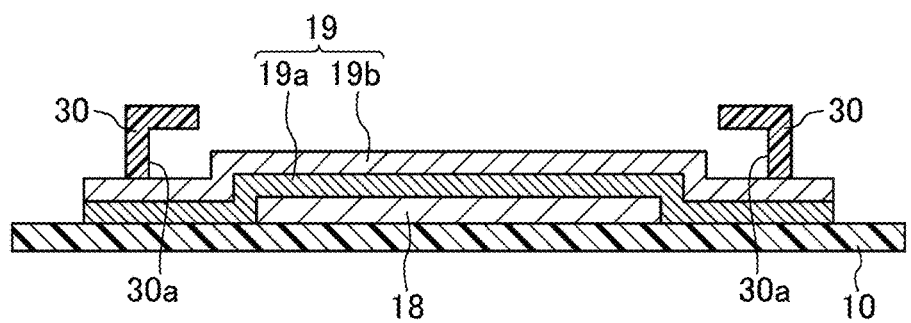
FIG. 7 is a cross-sectional view illustrating the method for manufacturing the organic EL display device according to the first embodiment of the disclosure.

Next, as illustrated in FIG. 7, a partition 30 is provided on the first inorganic layer 19 such that the partition 30 is disposed inward from the edges of the first inorganic film 19. The partition 30 defines a coating region of an organic material for forming the organic layer 20 (i.e., a formation region of the organic layer 20).

Moreover, in a case of using a metal mask for the partition 30, a magnet member (not illustrated) having a magnetic force is provided on a surface of the base substrate 10, opposite to the side on which the partition 30 is provided, so that the magnetic force of the magnet member allows the partition 30 to be secured on the first inorganic layer 19.

Next, an organic material is stacked on the surface 26 of the silicon nitride layer 19b and inside the partition 30 (i.e., a formation region of the organic layer 20 illustrated in FIG. 2) by using, for example, an ink-jet method or a vacuum vapor deposition method. Examples of the organic material include acrylate, polyurea, parylene, polyimide, and polyamide. Thus, the organic layer 20 formed of the organic film is formed on the surface 26 of the silicon nitride layer 19b, as illustrated in FIG. 8.

Here, the partition 30 thus provided on the first inorganic layer 19 restricts spreading of an organic material applied at the time of forming the organic layer 20.

Figure 8:
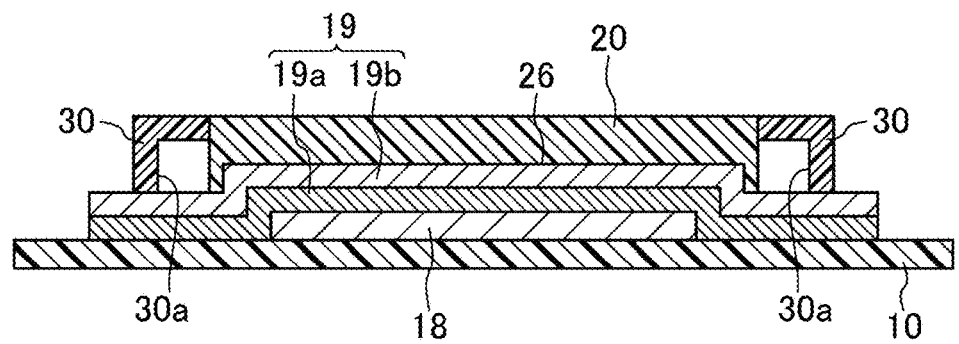
FIG. 8 is a cross-sectional view illustrating the method for manufacturing the organic EL display device according to the first embodiment of the disclosure.

Further, as illustrated in FIG. 8, a recessed portion 30a is formed on a side of the partition 30, the side facing the organic layer 20. At this time, the organic material that constitutes the organic layer 20 does not spread to the inner part of the recessed portion 30a and remains around the partition 30 by surface tension of the organic material. Thus, the recessed portion 30a enables a water-repellent function to be provided. As a result, the recessed portion 30a can certainly restrict the spreading of the organic material at the time of forming the organic layer 20.

Specifically, as illustrated in FIG. 8, a cavity in which the organic layer 20 is not formed is provided inside the recessed portion 30a on the first inorganic layer 19 in a process for forming the organic layer 20 described below. As illustrated in FIG. 1, the organic layer 20 is formed inside the first inorganic layer 19 in a plan view.

Next, after the organic layer 20 is cured, the partition 30 is removed from the surface of the first inorganic layer 19. For example, in a case of using the metal mask for the partition 30, the organic material is cured by heating, and then the base substrate 10 and the partition 30 are cooled so that the partition 30 can be separated and removed from the surface of the first inorganic layer 19.

Next, the second inorganic layer 21 is formed on the first inorganic layer 19 to cover the organic layer 20. More specifically, first, silicon oxide is stacked over the surface of the organic layer 20 by using, for example, a plasma CVD method with a mask, a sputtering method, or an atomic layer deposition method (ALD method). Thus, the silicon oxide layer 21a is formed to cover the surface of the organic layer 20, as illustrated in FIG. 2.

Next, as with the silicon oxide layer 21a described above, silicon nitride is stacked on the surface of the silicon oxide layer 21a by using, for example, a plasma CVD method with a mask, a sputtering method, or an atomic layer deposition method (ALD method). Thus, the silicon nitride layer 21b is formed to cover the surface of the organic layer 20, as illustrated in FIG. 2. In this manner, the second inorganic layer 21, which includes the silicon oxide layer 21a and the silicon nitride layer 21b, is formed; and the sealing film 25, which includes the first inorganic layer 19, the organic layer 20, and the second inorganic layer 21, is formed.

The organic EL display device 1 of the present embodiment can be manufactured as described above.

The method for manufacturing the organic EL display device 1 of the present embodiment described above produces the following effects (1) and (2).

(1) After the partition 30 is formed on the first inorganic layer 19, an organic material is applied inward from the partition 30 on the surface of the first inorganic layer 19 to form the organic layer 20 on the first inorganic layer 19. After that, the partition 30 is removed. Accordingly, since the known dam wall is not necessary, the frame region N does not need to include the dam wall. As a result, the frame narrowing of the organic EL display device 1 can be performed.

(2) The partition 30 has the recessed portion 30a on a side facing the organic layer 20. The recessed portion 30a causes a water-repellent function to be provided, and thus the spreading of the organic material is certainly restricted at the time of forming the organic layer 20.

Second Embodiment

Figure 9:
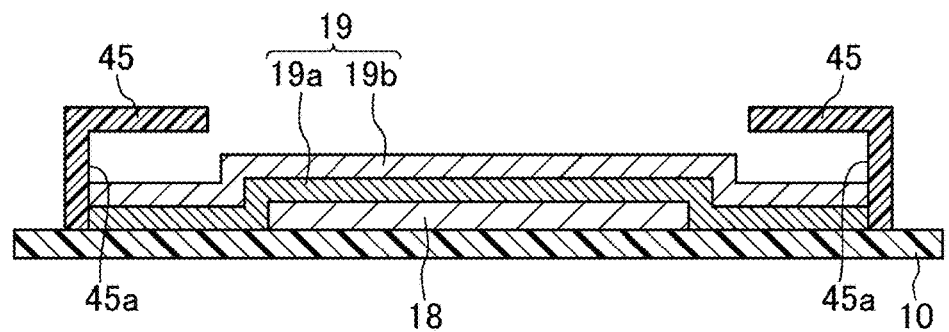
FIG. 9 is a cross-sectional view illustrating a terminal section of an organic EL display device according to a second embodiment of the disclosure.
Figure 10:
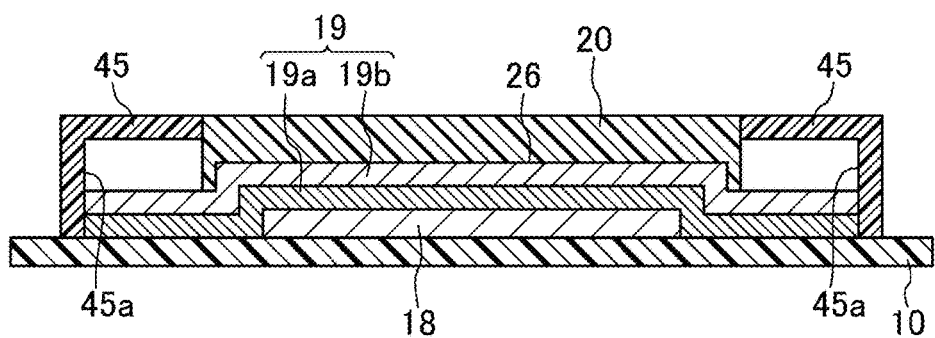
FIG. 10 is a cross-sectional view of the organic EL display device according to the second embodiment of the disclosure.

A second embodiment of the disclosure will be described below. FIGS. 9 and 10 are cross-sectional views, each illustrating a method for manufacturing the organic EL display device according to the present embodiment. Note that the entire configuration of the organic EL display device is the same as that of the first embodiment described above, and detailed descriptions thereof will be omitted. Note that elements common to those in the first embodiment are denoted by the same reference signs, and duplicated descriptions thereof will be omitted.

In a case of manufacturing the organic EL display device 1 according to the embodiment, a mask 45 having a larger opening than the display region D is fixed onto the base substrate. Note that the mask 45 defines a coating region of an organic material for forming the organic layer 20 (i.e., a formation region of the organic layer 20).

Further, as illustrated in FIG. 9, as with the recessed portion 30a of the partition 30, a recessed portion 45a is formed on a side of the mask 45, the side facing the organic layer 20. The recessed portion 45a has the same function as the recessed portion 30a of the partition 30.

In addition, a metal mask is used for the mask 45. As with the partition 30 according to the first embodiment, a magnet member (not illustrated) having magnetic force is provided on a surface of the base substrate 10 opposite to the surface having the mask 45. Thus, the magnetic force of the magnet member retains the mask 45 on the base substrate 10.

More specifically, first, silicon oxide is stacked on the surfaces of the base substrate 10 and the organic EL element 18 by using, for example, a plasma CVD method, a sputtering method, or an atomic layer deposition method (ALD method) using the mask 45. Thus, the silicon oxide layer 19*a* is formed to cover the surface of the organic EL element 18, as illustrated in FIG. 9.

Next, as with the silicon oxide layer 19*a* described above, silicon nitride is stacked on the surface of the silicon oxide layer 19*a* by using, for example, a plasma CVD method, a sputtering method, or an atomic layer deposition method (ALD method) using the mask 45. Thus, the silicon nitride layer 19*b* is formed to cover the surface of the organic EL element 18, as illustrated in FIG. 9. In this manner, the first inorganic layer 19, which includes the silicon oxide layer 19*a* and the silicon nitride layer 19*b*, is formed.

Next, an organic material is applied inward from the edges of the first inorganic layer 19 (i.e., a formation region of the organic layer 20 illustrated in FIG. 2) on the surface 26 of the silicon nitride layer 19*b* by using, for example, an ink-jet method or a vacuum vapor deposition method.

Examples of the organic material include acrylate, polyurea, parylene, polyimide, and polyamide. Thus, the organic layer 20 formed of the organic film is formed on the surface 26 of the silicon nitride layer 19*b*, as illustrated in FIG. 10.

Here, as with the partition 30 of the first embodiment, a cavity in which the organic layer 20 is not formed is provided inside the recessed portion 45*a* on the first inorganic layer 19 in a process for forming the organic layer 20 as illustrated in FIG. 10. Thus, the organic layer 20 is formed inside the first inorganic layer 19 in a plan view as illustrated in FIG. 1.

Note that after the organic material is applied, the organic layer 20 is provisionally cured by UV irradiation, with the mask 45 that functions as a partition being provided. After that, the organic layer 20 is baked at approximately 70 to 100° C. and thus completely cured. Alternatively, preheating, which is executed at the time of forming the second inorganic layer 21 by using a CVD method described below, can replace such baking.

Next, after the organic layer 20 is cured, the mask 45 is removed from the surface of the base substrate 10.

Next, as with the first embodiment, the second inorganic layer 21 including the silicon oxide layer 21*a* and the silicon nitride layer 21*b* is formed on the first inorganic layer 19 to cover the organic layer 20, thus forming the sealing film 25 including the first inorganic layer 19, the organic layer 20, and the second inorganic layer 21.

The organic EL display device 1 according to the present embodiment can be manufactured as described above.

The manufacturing method for the organic EL display device 1 according to the present embodiment described above produces the following effect (3) in addition to the effects (1) and (2) described above.

(3) The mask 45 used for forming the first inorganic layer 19 is also used as a partition at the time of forming the organic layer 20. This simplifies the process for manufacturing the organic layer 20 and saves costs.

Note that the embodiments described above can be modified as follows.

Figure 11:
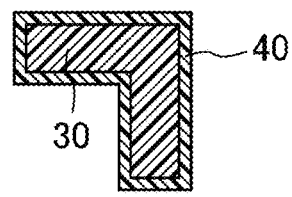
FIG. 11 is a cross-sectional view of a modified example of an organic EL display device according to the disclosure.

As illustrated in FIG. 11, a Teflon coating layer 40 can be formed on the surface of the partition 30 of the embodiments described above. Such configuration imparts water-repellent property not only to the recessed portion 30*a* described above but also to the entire surface of the partition 30. This can suppress variation in a formation region of the organic layer 20 at the time of forming the organic layer 20. Moreover, this can prevent an inconvenience in which an organic material for forming the organic layer 20 adheres to the surface of the partition 30 and cures.

In the embodiments described above, the metal mask made of, for example, SUS is used for the partition 30. However, the partition 30 can be also formed by patterning a photosensitive organic resin material by use of a gray tone mask or a half-tone mask.

Figure 12:
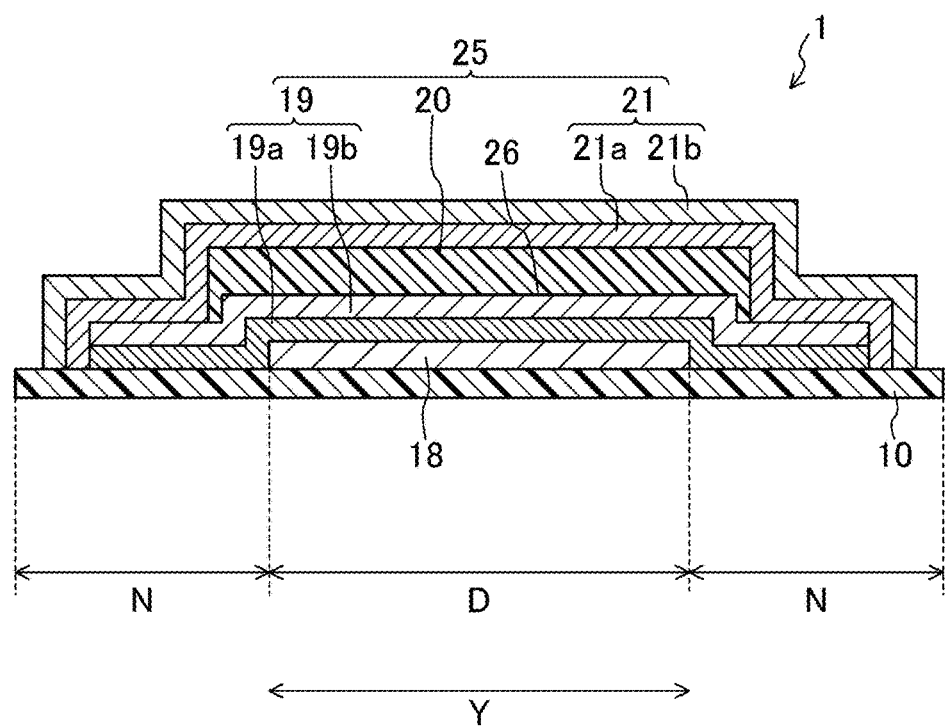
FIG. 12 is a cross-sectional view of a modified example of an organic EL display device according to the disclosure.

Moreover, the mask used for forming the second inorganic layer 21 can be also disposed outward from the partition 30 or the mask 45 (outward in the width direction Y of the organic EL display device 1 illustrated in FIG. 12) of the embodiments described above so that the second inorganic layer 21 can be provided to cover a peripheral edge of the first inorganic layer 19 as illustrated in FIG. 12.

In the embodiments described above, the example of the organic EL layer is given that has the five-layer structure including the hole injection layer, the hole transport layer, the light emitting layer, the electron transport layer, and the electron injection layer. The organic EL layer may have, for example, a three-layer structure including a hole injection-transport layer, a light emitting layer, and an electron transport-injection layer.

In the embodiments described above, the example of the organic EL display device is given that includes the first electrode as an anode and the second electrode as a cathode. However, the disclosure is also applicable to an organic EL display device, in which the layered structure of the organic EL layer is reversed, with the first electrode being a cathode and the second electrode being an anode.

In the embodiments described above, the example of the organic EL display device is given that includes the element substrate in which the electrode of the TFT connected to the first electrode is the drain electrode. However, the disclosure is also applicable to an organic EL display device including an element substrate in which the electrode of the TFT connected to the first electrode is referred to as the source electrode.

In the embodiments described above, organic EL display devices are described as display devices by way of example. The disclosure is also applicable to display devices including a plurality of electro-optical elements that are driven by an electrical current. For example, the disclosure is applicable to display devices including quantum dot light emitting diodes (QLEDs), which are light emitting elements using a quantum dot-containing layer.

INDUSTRIAL APPLICABILITY

As described above, the disclosure is useful for manufacturing methods for organic EL display devices.

REFERENCE SIGNS LIST

1 Organic EL display device
10 Base substrate
11 Base coating film
12 TFT
13 Interlayer insulating film
16 Organic EL layer
18 Organic EL element
19 First inorganic layer
20 Organic layer
21 Second inorganic layer
25 Sealing film
30 Partition
30A Recessed portion
40 Teflon coating layer
45 Mask

The invention claimed is:

1. A method for manufacturing a display device, the method comprising:
   forming a light emitting element on a base substrate; and
   forming a sealing film to cover the light emitting element,
   wherein the forming a sealing film includes
   fixing a mask including a larger opening than a display region on the base substrate,
   forming a first inorganic layer inside the mask to cover the light emitting element,
   forming an organic layer on the first inorganic layer by applying an organic material inside the first inorganic layer on a surface of the first inorganic layer by use of the mask,
   removing the mask from the base substrate,
   forming a second inorganic layer on the first inorganic layer to cover the organic layer, and
   during the forming an organic layer, the organic layer is cured by UV irradiation with the mask being provided on the base substrate.

2. The method for manufacturing a display device according to claim 1,
   wherein the mask includes a recessed portion on a side facing the organic layer.

3. The method for manufacturing a display device according to claim 2,
   wherein during the forming an organic layer, a cavity in which the organic layer is not formed is provided inside the recessed portion on the first inorganic layer to form the organic layer inside the first inorganic layer in a plan view.

4. The method for manufacturing a display device according to claim 1,
   wherein the light emitting element is an organic EL element.

5. The method for manufacturing a display device according to claim 1,
   wherein the base substrate is flexible.

* * * * *